(12) United States Patent
He et al.

(10) Patent No.: US 12,328,910 B2
(45) Date of Patent: Jun. 10, 2025

(54) THIN-FILM TRANSISTOR, MANUFACTURING METHOD THEREOF, ARRAY SUBSTRATE AND DISPLAY PANEL

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN); Xue Liu, Beijing (CN); Zhi Wang, Beijing (CN); Feng Guan, Beijing (CN)

(73) Assignee: BOE TECHNOLOGY GROUP CO., TD., Beijing (CN)

( * ) Notice: Subject to any disclaimer, the term of this patent is extended or adjusted under 35 U.S.C. 154(b) by 447 days.

(21) Appl. No.: 17/772,689

(22) PCT Filed: Jun. 24, 2021

(86) PCT No.: PCT/CN2021/102108
§ 371 (c)(1),
(2) Date: Apr. 28, 2022

(87) PCT Pub. No.: WO2021/259361
PCT Pub. Date: Dec. 30, 2021

(65) Prior Publication Data
US 2023/0036385 A1    Feb. 2, 2023

(30) Foreign Application Priority Data
Jun. 24, 2020    (CN) .......................... 202010590208.9

(51) Int. Cl.
*H01L 29/78*    (2006.01)
*H10D 30/01*    (2025.01)
(Continued)

(52) U.S. Cl.
CPC ..... *H10D 30/6757* (2025.01); *H10D 30/0321* (2025.01); *H10D 30/6743* (2025.01); *H10D 62/121* (2025.01)

(58) Field of Classification Search
CPC ........... H01L 29/78696; H01L 29/0673; H01L 29/6675; H01L 29/78651; H01L 27/1218;
(Continued)

(56) References Cited

U.S. PATENT DOCUMENTS 8,173,993 B2 *    5/2012    Bangsaruntip .... H01L 29/78696
                                                          257/E21.409
8,652,944 B2 *    2/2014    Roca ................. H01L 21/02603
                                                               977/938
(Continued)

FOREIGN PATENT DOCUMENTS

CN          1652350 A        8/2005
CN          103346070 A      10/2013
(Continued)

OTHER PUBLICATIONS

The First Office Action dated Jun. 3, 2021 corresponding to Chinese application No. 202010590208.9.
(Continued)

*Primary Examiner* — Shouxiang Hu
(74) *Attorney, Agent, or Firm* — Nath, Goldberg & Meyer; Joshua B. Goldberg

(57) ABSTRACT

The disclosure provides a thin-film transistor, a manufacturing method thereof, an array substrate and a display panel, and belongs to the technical field of thin-film transistor devices. The thin-film transistor includes a base substrate, an active layer on the base substrate including a plurality of semiconductor nanowires, and a plurality of guiding projections on the base substrate which extend along a first direction and are arranged at intervals and each of
(Continued)

which includes two side walls extending along the first direction, and the semiconductor nanowire extends along a side wall of the guiding projection. In the thin-film transistor, since the semiconductor nanowires are used as the active layer, mobility and concentration of carriers in the thin-film transistor can be effectively increased and therefore performance of the thin-film transistor can be improved. A length of the semiconductor nanowire is not limited, and a size of the thin-film transistor is not limited.

18 Claims, 5 Drawing Sheets

(51) Int. Cl.
*H10D 30/67* (2025.01)
*H10D 62/10* (2025.01)

(58) Field of Classification Search
CPC ......... H01L 29/66742; H01L 29/78675; H01L 29/66757; B82Y 10/00; B82Y 30/00; B82Y 40/00; H10K 59/1213; H10D 30/6757; H10D 30/0321; H10D 30/6743; H10D 62/121; H10D 30/031; H10D 86/411; H10D 86/60; H10D 30/0314; H10D 30/6745; H10D 30/6731

See application file for complete search history.

(56) References Cited

U.S. PATENT DOCUMENTS

| | | | |
|---|---|---|---|
| 10,170,376 | B1 | 1/2019 | Hung |
| 2013/0285149 | A1* | 10/2013 | Fonash ............ H01L 29/78618 |
| | | | 257/288 |
| 2016/0274285 | A1 | 9/2016 | Kang et al. |
| 2019/0341497 | A1* | 11/2019 | Leobandung ..... H01L 29/66606 |

FOREIGN PATENT DOCUMENTS

| | | |
|---|---|---|
| CN | 103985751 A | 8/2014 |
| CN | 106082121 A | 11/2016 |
| CN | 111682076 A | 9/2020 |

OTHER PUBLICATIONS

The Second Office Action dated Mar. 1, 2022 corresponding to Chinese application No. 202010590208.9.
Rejection dated Sep. 27, 2022 corresponding to Chinese application No. 202010590208.9.
Fan, Zheng, et al. "In-Situ TEM Observation of In-Plane Silicon Nanowires Growth Via Solid-Liquid-Solid Process: Reactive Wetting of Indium Droplets on a-Si:H"; Nov. 2016; ResearchGate.
"Guided Positioning Technology and Device Characterization of Planar Silicon Nanowires"; 2017.
"Nanotechnology and Physics" Sep. 15, 2022.
"Light and Precious Metal Metallergy" Sep. 15, 2022.

* cited by examiner

THIN-FILM TRANSISTOR, MANUFACTURING METHOD THEREOF, ARRAY SUBSTRATE AND DISPLAY PANEL

This is a National Phase Application filed under 35 U.S.C. 371 as a national stage of PCT/CN2021/102108, filed Jun. 24, 2021, an application claiming the benefit of Chinese Application No. 202010590208.9, filed Jun. 24, 2020, the content of each of which is hereby incorporated by reference in its entirety.

CROSS-REFERENCE TO RELATED APPLICATIONS

The present disclosure claims the priority of the Chinese Patent Application No. 202010590208.9 filed with the Chinese Patent Office dated Jun. 24, 2020, the entire contents of which are incorporated herein by reference.

TECHNICAL FIELD

The present disclosure belongs to the technical field of thin-film transistor devices, and particularly, relates to a thin-film transistor, a manufacturing method thereof, an array substrate and a display panel.

BACKGROUND

Thin-film transistors (TFTs) can be applied in various electrical apparatuses, such as display panels, and can be used to drive light-emitting devices in the display panels or act as switching units or the like for the light-emitting devices. Key indicators of the thin-film transistors include mobility. The mobility of the thin-film transistors in the related art is relatively low due to such limiting factors as manufacturing processes and structures of active layers, and therefore, it is difficult for the thin-film transistors to drive the light-emitting devices with high efficiency.

SUMMARY

The present disclosure provides a thin-film transistor, a manufacturing method thereof, an array substrate and a display panel.

The thin-film transistor includes a base substrate and an active layer disposed on the base substrate, wherein the active layer includes a plurality of semiconductor nanowires; the thin-film transistor further includes: a plurality of guiding projections disposed on a side of the base substrate close to the active layer, the plurality of guiding projections extending along a first direction and being arranged at intervals, each guiding projection of the plurality of guiding projections including two side walls extending along the first direction, and the plurality of semiconductor nanowires extending along at least one side wall of the plurality of guiding projections, respectively.

In some embodiments, the plurality of semiconductor nanowires are silicon nanowires; and/or the base substrate is a glass substrate or a polyethylenimine substrate.

In some embodiments, the base substrate and the plurality of guiding projections are of a one-piece structure.

In some embodiments, the plurality of guiding projections are successively arranged along a second direction perpendicular to the first direction at equal intervals; and the plurality of semiconductor nanowires are disposed on a plurality of side walls on a same side of the plurality of guiding projections, respectively.

In some embodiments, the plurality of guiding projections are successively arranged along a second direction perpendicular to the first direction at equal intervals; and the plurality of semiconductor nanowires are disposed on all side walls of the plurality of guiding projections, respectively.

In some embodiments, the thin-film transistor further includes: a source electrode and a drain electrode arranged in a same layer and disposed on a side of the active layer away from the base substrate; and the source electrode and the drain electrode connected to two ends of each semiconductor nanowire of the plurality of semiconductor nanowires.

A manufacturing method of a thin-film transistor according to the present disclosure includes: preparing a base substrate; forming a plurality of guiding projections on the base substrate, the plurality of guiding projections extending along a first direction and being arranged at intervals, and each guiding projection of the plurality of guiding projections including two side walls extending along the first direction; and forming a plurality of semiconductor nanowires as an active layer on the base substrate, and the plurality of semiconductor nanowires extending along at least one side wall of the plurality of guiding projections.

In some embodiments, the forming the plurality of guiding projections on the base substrate includes: depositing a layer of silicon oxide on a side of the base substrate close to the active layer to form a guiding projection material layer; and forming the plurality of guiding projections extending along the first direction on a side of the guiding projection material layer away from the base substrate by a patterning process.

In some embodiments, the forming the plurality of guiding projections extending along the first direction on the side of the guiding projection material layer away from the base substrate by the patterning process includes: forming the plurality of guiding projections extending along the first direction on the side of the guiding projection material layer away from the base substrate by a nano-imprinting process or a photolithography process.

In some embodiments, a material of the base substrate and the plurality of guiding projections includes glass, and the forming the plurality of guiding projections on the base substrate includes forming the base substrate and the plurality of guiding projections on the base substrate as a one-piece structure by a single process.

In some embodiments, the forming the plurality of semiconductor nanowires as the active layer on the base substrate includes: forming a plurality of guiding particles at an end of at least one side wall of the plurality of guiding projections; and depositing a layer of semiconductor material on a side of the plurality of guiding projections away from the base substrate such that the semiconductor material is guided by the plurality of guiding particles to grow along the at least one side wall of the plurality of guiding projections to form plurality of the semiconductor nanowires.

In some embodiments, the forming the plurality of guiding particles at the end of the at least one side wall of the plurality of guiding projections includes: depositing a guiding material at the end of the at least one side wall of the plurality of guiding projections, wherein the guiding material and the plurality of guiding particles have a same chemical element; and converting the guiding material into the plurality of guiding particles by a plasma treatment in a plasma enhanced chemical vapor deposition system.

In some embodiments, the guiding material is indium tin oxide, and the plurality of guiding particles are indium.

In some embodiments, the depositing the layer of semiconductor material on the side of the plurality of guiding projections away from the base substrate such that the semiconductor material is guided by the plurality of guiding particles to grow along the at least one side wall of the plurality of guiding projections to form the plurality of semiconductor nanowires includes: depositing the layer of semiconductor material on the side of the plurality of guiding projections away from the base substrate at a temperature ranging from 180° C. to 220° C.; and forming the plurality of semiconductor nanowires by causing the semiconductor material to be guided by the plurality of guiding particles to grow along the at least one side wall of the plurality of guiding projections under an inert or reducing gas and at a temperature ranging from 250° C. to 350° C.

In some embodiments, the semiconductor material includes amorphous silicon, and the plurality of semiconductor nanowires include silicon nanowires.

In some embodiments, after the forming the plurality of semiconductor nanowires by causing the semiconductor material to be guided by the guiding material to grow along the at least one side wall of the plurality of guiding projections under the inert or reducing gas and at the temperature ranging from 250° C. to 350° C., the manufacturing method further includes: converting the amorphous silicon into polycrystalline silicon by an annealing process at a temperature ranging from 180° C. to 220° C., and removing the polycrystalline silicon.

In some embodiments, after the removing the polycrystalline silicon, the manufacturing method further includes: performing a passivation treatment on the plurality of semiconductor nanowires.

An array substrate according to the present disclosure includes: a driving circuit including the thin-film transistor as described above.

A display panel according to the present disclosure includes the array substrate as described above.

In some embodiments, the display panel further includes an active-matrix organic light-emitting diode or a passive-matrix organic light-emitting diode.

DETAILED DESCRIPTION OF THE EXEMPLARY EMBODIMENTS

Figure 1:
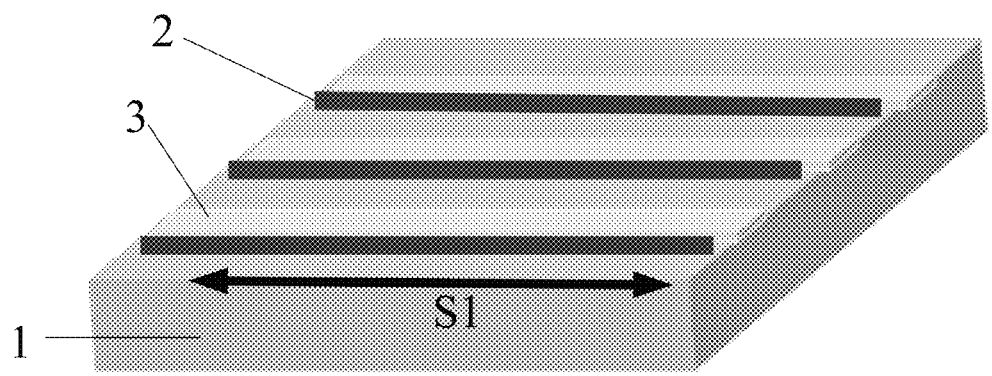
FIG. 1 is a schematic diagram of a structure of a thin-film transistor provided in some embodiments of the present disclosure (only a base substrate, a plurality of guiding projections and an active layer of the thin-film transistor are shown)

A further detailed description is hereinafter given to the present disclosure with reference to accompanying drawings so as to make the objects, technical solutions and advantages thereof more apparent. Obviously, the embodiments described below are only a part of, not all of, the embodiments of the present disclosure. All other embodiments which can be derived by a person skilled in the art based on the embodiments of the present invention without creative efforts shall fall within the protection scope of the present invention.

A shape and a size of an element in the drawings are not intended to reflect a real scale, but are used to facilitate understanding of the contents in the embodiments of the present disclosure.

Unless otherwise defined, all the technical terms or scientific terms used in the present disclosure have the same meanings as commonly understood by a person skilled in the art to which the present disclosure belongs. The terms "first," "second" and the like, which are used in the present disclosure, are not intended to indicate any sequence, amount or importance, but are used to distinguish one constituent from another. Also, the term "one", "an/a", "the" or the like is not intended to limit the amount, but indicates the existence of at least one. The term "comprises", "comprising", "includes", "including" or the like, is intended to specify that the word stated before the term includes the elements or the objects and equivalents thereof listed after the word, but does not preclude the other elements or objects. The term "connect", "connected" or the like is not intended to define a physical connection or mechanical connection, but may include an electrical connection, directly or indirectly. The term "on," "under," "right," "left" "top" "bottom" or the like is only used to indicate a relative position relationship, and when an absolute position of the object which is described is changed, the relative position relationship may be changed accordingly.

As shown in FIG. 1, some embodiments of the present disclosure provide a thin-film transistor, which includes a base substrate 1 and an active layer disposed on the base substrate 1. The active layer includes a plurality of semiconductor nanowires 2. The thin-film transistor further includes a plurality of guiding projections 3 (that is, a guiding layer) disposed on a side of the base substrate 1 close to the active layer; the plurality of guiding projections 3 extend along a first direction S1 and are arranged at intervals; each guiding projection 3 has two side walls extending along the first direction S1 and is configured to guide an extending direction of the semiconductor nanowire 2; the semiconductor nanowire 2 extends along one of the two side walls of the guiding projection 3, that is, the semiconductor nanowire 2, like the side wall of the guiding projection 3 that guides its extension, also extends along the first direction S1; and one guiding projection 3 may be attached with two semiconductor nanowires 2 on two side walls thereof, or may be attached with only one semiconductor nanowire 2 on only one of the two side walls thereof, which can be configured as needed. Description will hereinafter be made by taking the example of only one side wall of the guiding projection 3 attached with the semiconductor nanowire 2.

It is to be noted that in the present disclosure, the plurality of semiconductor nanowires 2 act as the active layer of the thin-film transistor. The guiding projections 3 may be made of a variety of materials, such as silicon oxide. The thin-film transistor shown in FIG. 1 includes three guiding projections 3. However, the present disclosure is not limited thereto, and the thin-film transistor may include more guiding projections 3, which may be arranged in a denser layout. The number of the guiding projections 3 and a spacing between two adjacent guiding projections 3 may be configured as needed and are not limited herein.

It is to be noted that the first direction S1 may be any direction, such as a lengthwise direction of the base substrate 1, which may be configured as needed.

In one embodiment, the plurality of guiding projections 3 are arranged at equal intervals along a second direction perpendicular to the first direction, the plurality of semiconductor nanowires may be disposed on a plurality of side walls on a same side of the plurality of guiding projections, respectively (as shown in FIG. 1), and accordingly, the plurality of semiconductor nanowires 2 in the thin-film transistor thus constructed are also arranged at equal intervals. However, the present disclosure is not limited thereto. For example, each guiding projection 3 may be provided with the semiconductor nanowires 2 on two sides thereof, which can further increase the density of the semiconductor nanowires 2, as shown in FIG. 2B.

It is to be noted that the thin-film transistor further includes a source electrode 41, a drain electrode 42, and a gate electrode 5; an orthographic projection of the gate electrode 5 on the base substrate 1 overlaps with that of the active layer thereon; and the source electrode 41 and the drain electrode 42 are connected to the active layer. FIG. 1 only shows the base substrate 1 and the active layer.

In the thin-film transistor provided in embodiments of the present disclosure, since the plurality of semiconductor nanowires 2 are used as the active layer of the thin-film transistor, channels for carriers increase, which can effectively increase the mobility and concentration of the carriers and therefore improve the performance of the thin-film transistor. In addition, since a length of each semiconductor nanowire 2 is not restricted, a size of the active layer is not restricted, which can enable the thin-film transistor to have an unrestricted size and be adaptable to display panels of various types.

A material of the semiconductor nanowire 2 is not limited herein. For example, the semiconductor nanowire 2 may be a silicon nanowire, a germanium nanowire or the like. The silicon nanowire may be formed by arranging silicon atoms, and it is advantageous to use silicon to form the active layer of the thin-film transistor due to its semiconductor properties. Description will hereinafter be made by taking the example of the semiconductor nanowire 2 being the silicon nanowire.

Optionally, the base substrate 1 may be a rigid substrate, such as a glass substrate or the like, or a flexible substrate, such as a polyethylenimine substrate or the like, and is not limited herein. The base substrate and the plurality of guiding projections 3 may be formed as one piece. That is, the plurality of guiding projections 3 and the base substrate 1 may be of a one-piece structure. The plurality of guiding projections 3 may be fabricated directly on the base substrate 1, and thereafter, each of the plurality of semiconductor nanowires 2 is formed along one side wall of a corresponding guiding projection 3. Alternatively, the base substrate 1 may be made of a material different from that of the guiding projections 3. For example, in a case where the guiding projections 3 are fabricated by a process using silicon, a guiding projection material layer may be formed by forming a silicon-based material on the base substrate 1 (e.g., the glass substrate), and the plurality of guiding projections 3 are then fabricated on a side of the guiding projection material layer away from the base substrate 1.

Figure 2A:
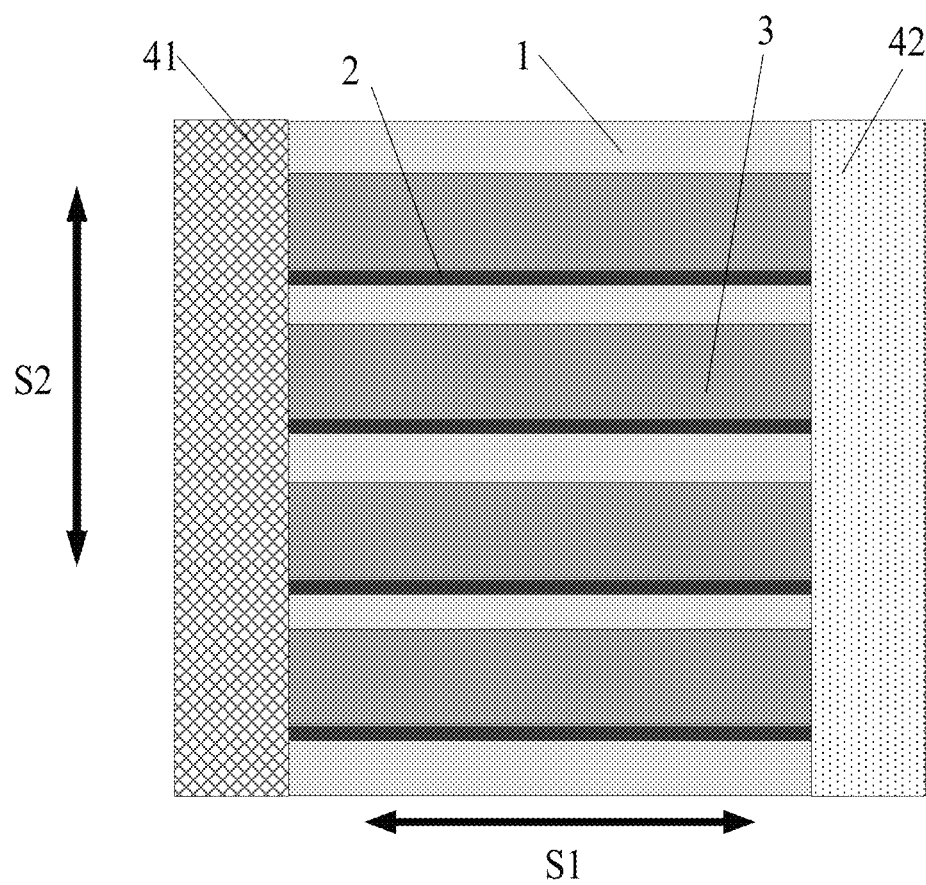
FIG. 2A is a schematic diagram of a structure of a thin-film transistor provided in some embodiments of the present disclosure (only a base substrate, a plurality of guiding projections, an active layer and a source electrode and a drain electrode of the thin-film transistor are shown)
Figure 2B:
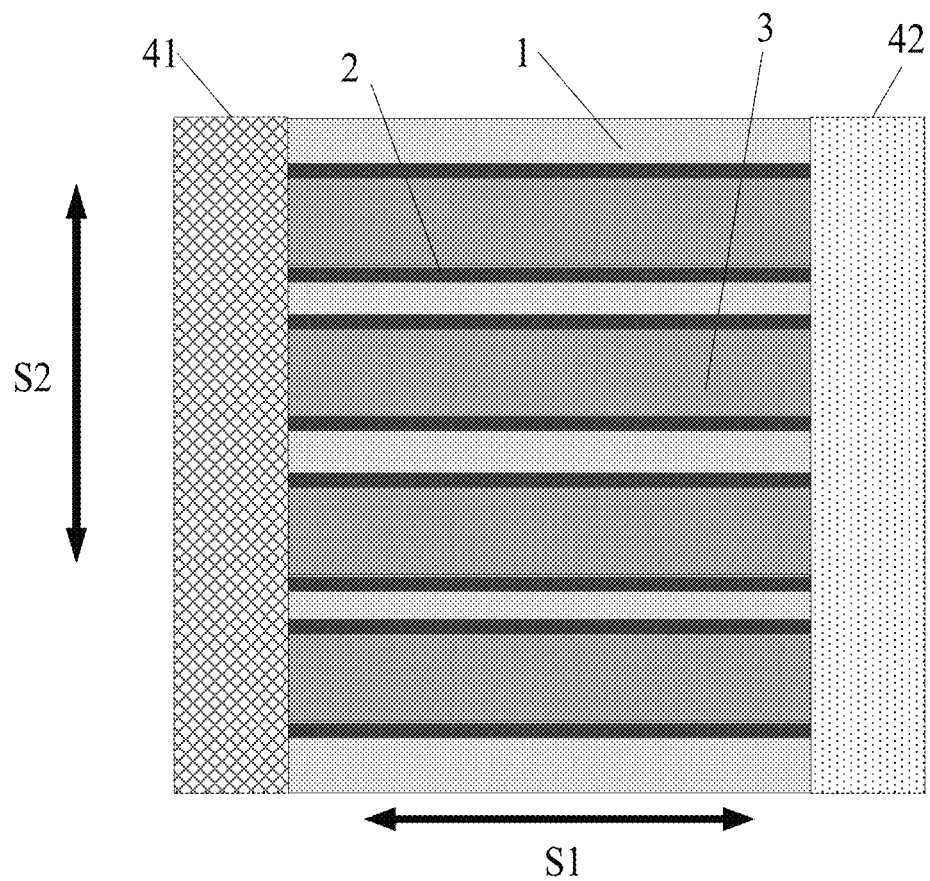
FIG. 2B is a schematic diagram of a structure of a thin-film transistor provided in some embodiments of the present disclosure (only a base substrate, a plurality of guiding projections, an active layer and a source electrode and a drain electrode of the thin-film transistor are shown)

As shown in FIGS. 2A and 2B, the source electrode 41 and the drain electrode 42 of the thin-film transistor provided in embodiments of the present disclosure are arranged in a same layer; both the source electrode 41 and the drain electrode 42 are connected to the active layer, and specifically, both of them are connected to two ends of each of the plurality of semiconductor nanowires 2 in the active layer; and the source electrode 41 and the drain electrode 42 extend along the second direction S2, and the first direction S1 and the second direction S2 may be arranged in any manner, provided that they are not parallel to each other, for example, the first direction S1 and the second direction S2 may be approximately perpendicular to each other.

Furthermore, as shown in FIGS. 3 to 6, the thin-film transistor includes the base substrate 1, the active layer, the source electrode 41, the drain electrode 42 and the gate electrode 5. The thin-film transistor provided in embodiments of the present disclosure may adopt a variety of structures, and in different structures of the thin-film transistor, respective positions of the active layer, the source electrode 41, the drain electrode 42 and the gate electrode 5 are different. Description will hereinafter be made with reference to FIGS. 3 to 6 in which an upper side of the illustrated structure is taken as top, and a lower side thereof is taken as bottom.

Figure 3:
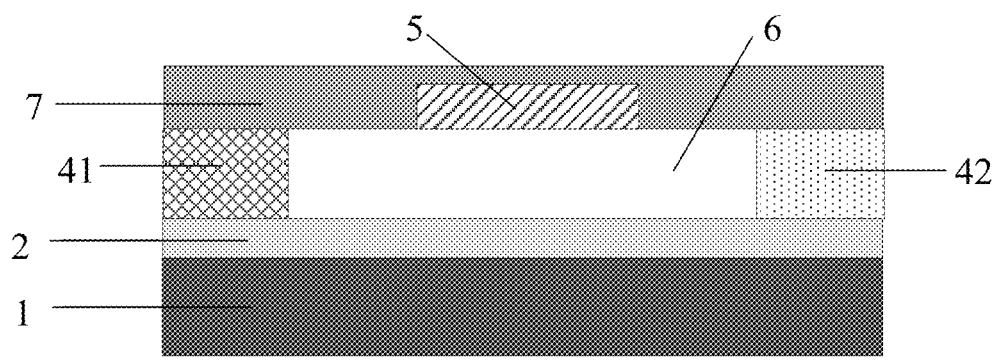
FIG. 3 is a schematic diagram of a structure of a thin-film transistor (top gate, top contact) provided in some embodiments of the present disclosure.

Referring to FIG. 3, the thin-film transistor provided in some embodiments of the present disclosure is of a top-gate top-contact structure. In other words, the active layer (that is, the plurality of semiconductor nanowires 2) is disposed on the base substrate 1; the source electrode 41 and the drain electrode 42 are disposed on a top surface of the active layer and arranged in a same layer; the gate electrode 5 is disposed on a side of the source electrode 41 and the drain electrode 42 away from the active layer; a gate insulation layer 6 is disposed between the gate electrode 5 and the active layer; and a protective layer 7 is disposed on a side of the gate electrode 5 away from the active layer.

Figure 4:
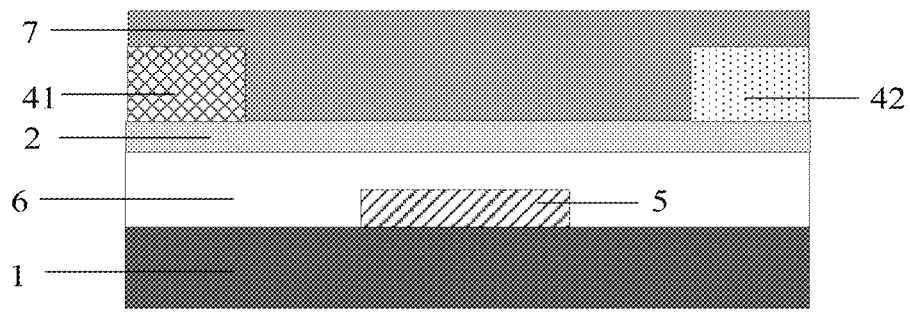
FIG. 4 is a schematic diagram of a structure of a thin-film transistor (bottom gate, top contact) provided in some embodiments of the present disclosure.

Referring to FIG. 4, the thin-film transistor provided in some embodiments of the present disclosure is of a bottom-gate top-contact structure. In other words, the gate electrode 5 is disposed on the base substrate 1; the active layer (that is, the plurality of semiconductor nanowires 2) is disposed on a side of the gate electrode 5 away from the base substrate 1; the gate insulation layer 6 is disposed between the gate electrode 5 and the active layer; the source electrode 41 and the drain electrode 42 are disposed on the top surface of the active layer and arranged in the same layer; and the protective layer 7 is disposed on the side of the source electrode 41 and the drain electrode 42 away from the active layer.

Figure 5:
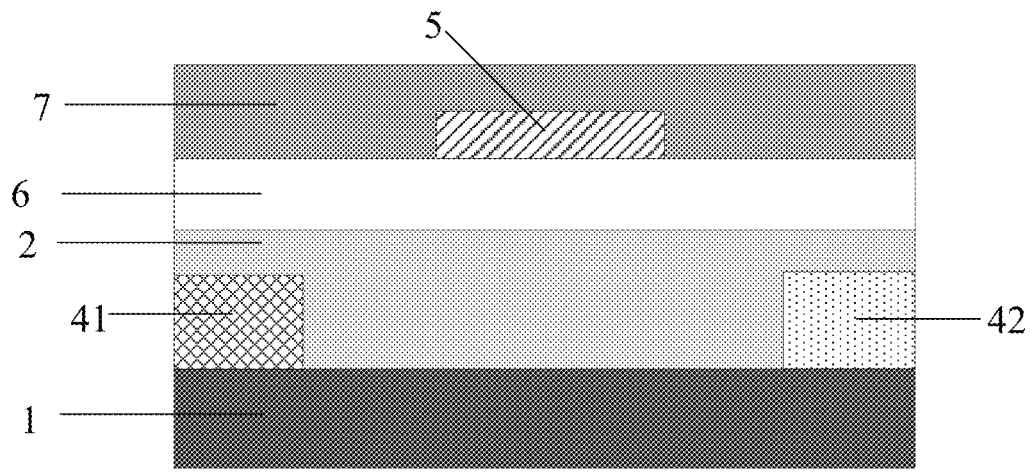
FIG. 5 is a schematic diagram of a structure of a thin-film transistor (top gate, bottom contact) provided in some embodiments of the present disclosure.

Referring to FIG. 5, the thin-film transistor provided in some embodiments of the present disclosure is of a top-gate bottom-contact structure. In other words, the source electrode 41 and the drain electrode 42 are disposed on the base substrate 1, and are arranged in the same layer; the active layer (that is, the plurality of semiconductor nanowires 2) is disposed on the side of the source electrode 41 and the drain electrode 42 away from the base substrate 1, that is, the source electrode 41 and the drain electrode 42 are connected to the active layer through a bottom surface of the active layer; the gate electrode 5 is disposed on the side of the active layer away from the base substrate 1; the gate insulation layer 6 is disposed between the gate electrode 5 and the active layer; and the protective layer 7 is disposed on the side of the gate electrode 5 away from the active layer.

Figure 6:
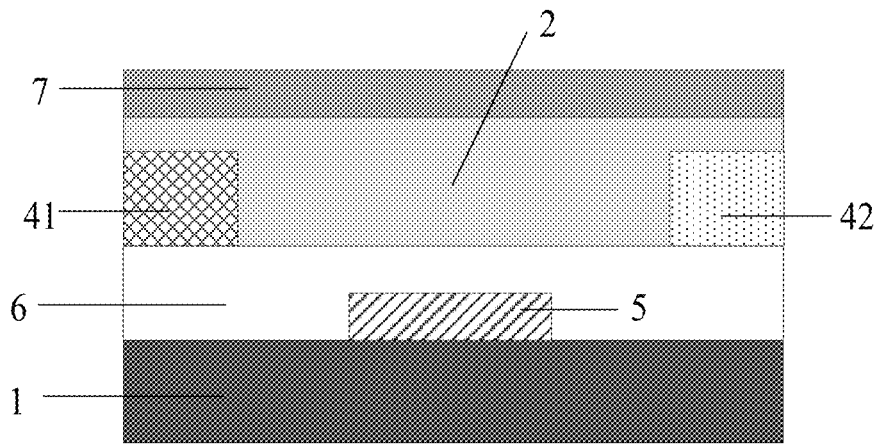
FIG. 6 is a schematic diagram of a structure of a thin-film transistor (bottom gate, bottom contact) provided in some embodiments of the present disclosure.

Referring to FIG. 6, the thin-film transistor provided in some embodiments of the present disclosure is of a bottom-gate bottom-contact structure. In other words, the gate electrode 5 is disposed on the base substrate 1; the source electrode 41 and the drain electrode 42 are disposed on the side of the gate electrode 5 away from the base substrate 1, and are arranged in the same layer; the gate insulation layer 6 is disposed between the layer where the source electrode 41 and the drain electrode 42 are arranged and the gate electrode 5; the active layer (that is, the plurality of semiconductor nanowires 2) is disposed on the side of the source electrode 41 and the drain electrode 42 away from the base substrate 1, that is, the source electrode 41 and the drain electrode 42 are connected to the active layer through the bottom surface of the active layer; and the protective layer 7 is disposed on the side of active layer away from the base substrate 1.

The thin-film transistor provided in embodiments of the present disclosure may adopt any one of the structures as described above. In some embodiments, the thin-film transistor adopts the top-contact structure (as shown in FIGS. 3 and 4), that is, the source electrode 41 and the drain electrode 42 being disposed on the side of the active layer away from the base substrate 1 and connected to the active layer through the top surface of the active layer, which can prevent the semiconductor nanowires 2 in the active layer from being damaged during the etching of the source electrode 41 and the drain electrode 42.

Figure 7:
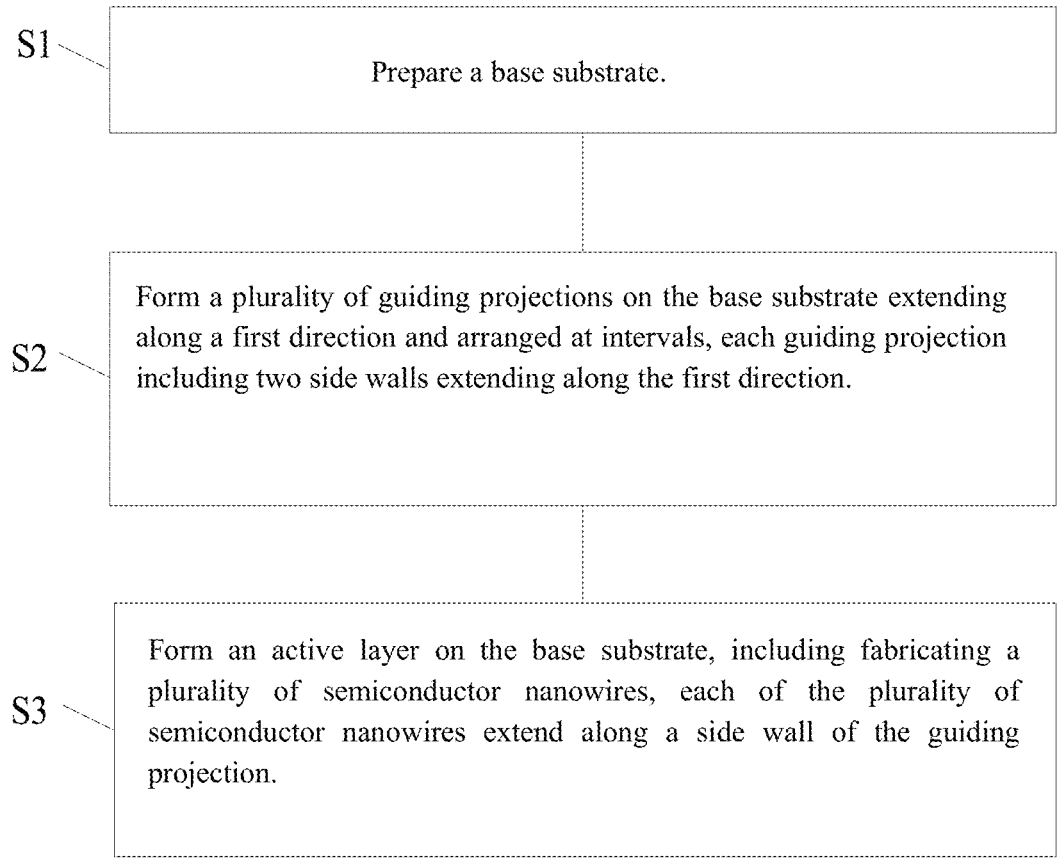
FIG. 7 is a flow chart of a method of manufacturing a thin-film transistor provided in some embodiments of the present disclosure.

As shown in FIG. 7, some embodiments of the present disclosure further provide a method of manufacturing a thin-film transistor, including the following steps:

S1: Preparing a base substrate 1.

Specifically, the base substrate 1 may be a substrate of any type, such as a glass substrate or any other rigid substrate, or a polyethylenimine substrate or any other flexible substrate. In some embodiments, the base substrate 1 and a guiding layer (including a plurality of guiding projections 3) in the active layer may be formed in a single process, that is, the base substrate 1 and the guiding layer are of a one-piece structure. For example, if both the base substrate 1 and the guiding layer are made of glass, the plurality of guiding projections 3 may be formed directly on the base substrate 1.

S2: Forming a plurality of guiding projections 3 extending along a first direction S1 and arranged at intervals, each of which includes two side walls extending along the first direction S1.

Description will hereinafter be made by taking the example of the guiding projections being made of a material different from that of the base substrate 1, and S2 may include the following sub-steps:

S21: Depositing silicon oxide (SiO) on a side of the base substrate 1 close to the active layer as a guiding projection material layer.

The guiding projection material layer is deposited on the base substrate 1 and is to be patterned to form the plurality of guiding projections 3, making it possible to use various types of substrate as the base substrate 1, as compared to the case where the plurality of guiding projections 3 are fabricated directly from a silicon wafer. For example, in a case where the base substrate 1 is the glass substrate or the polyethylenimine substrate, a layer of silicon oxide is deposited on the base substrate 1 to form the guiding projection material layer that may be used to form the plurality of guiding projections 3, thereby ensuring that the precision of the patterning process to form the plurality of guiding projections 3 is not affected. Moreover, in such a case, a variety of processes may be chosen as the patterning process so as to improve the precision of the patterning process.

Figure 8:
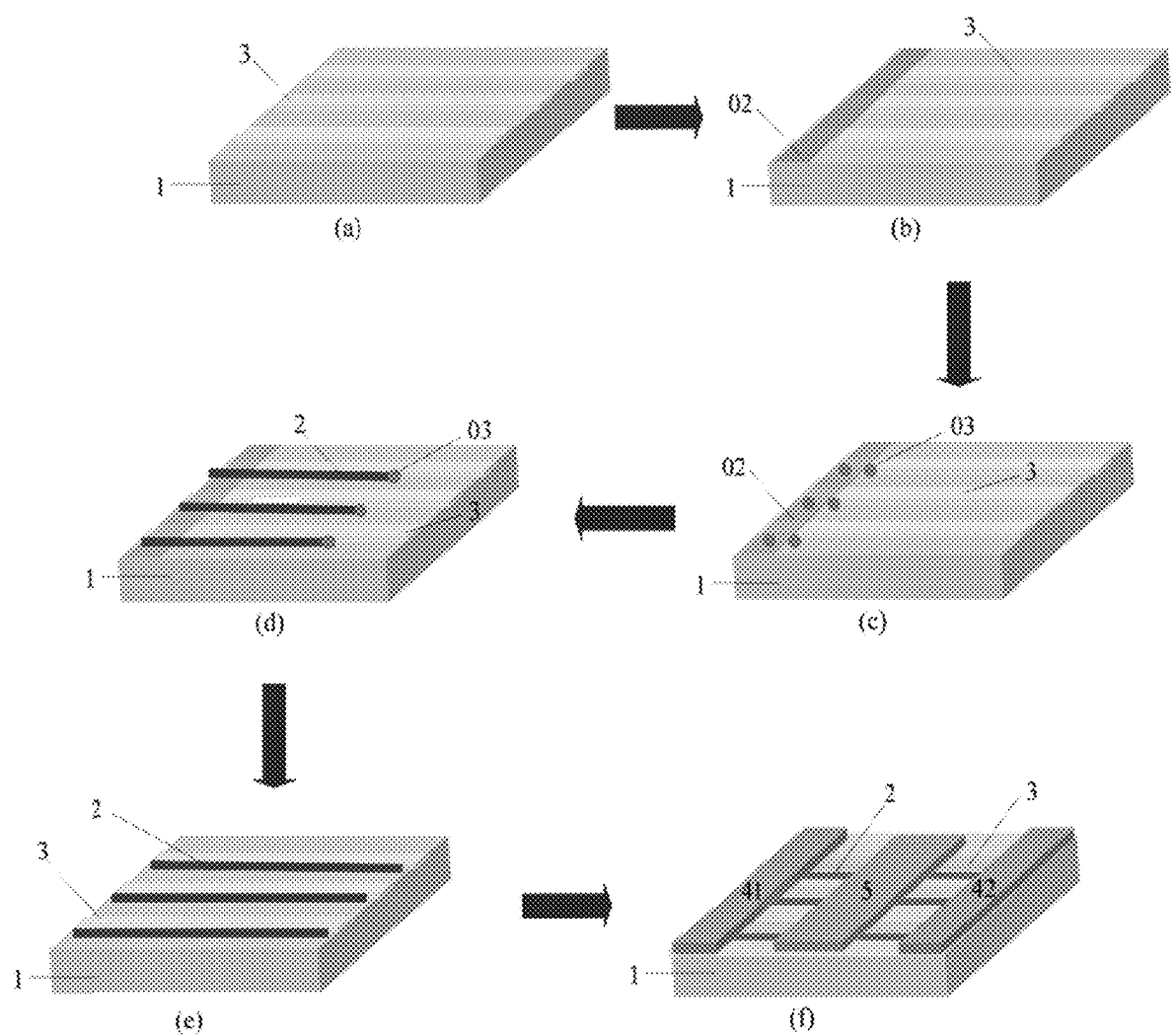
FIG. 8 is a schematic diagram showing manufacturing procedures in a method of manufacturing a thin-film transistor provided in some embodiments of the present disclosure.

S22: Forming the plurality of guiding projections 3 extending along the first direction S1 on a side of the guiding projection material layer away from the base substrate 1. As shown in FIG. 8(*a*), the silicon oxide forming the guiding projection material layer is the material of the guiding projections 3, and since the silicon oxide is beneficial for the patterning process to be performed precisely, using the silicon oxide to form the guiding projection material layer can make the structures of the guiding projections 3 more precise.

Specifically, in S22, the plurality of guiding projections 3 may be formed by patterning the guiding projection material layer through a nano-imprinting process or a photolithography process. In a case where the plurality of guiding projections 3 are formed by the nano-imprinting process, after deposition of the material (e.g., the silicon oxide) of the guiding projection material layer, an imprinting template is fabricated according to a desired pattern of the plurality of guiding projections 3, the imprinting template has a plurality of protruding structures, and a recess between every two adjacent protruding structures corresponds to a guiding projection 3; the imprinting template is pressed against the guiding projection material layer to correspondingly form a plurality of guiding projections 3; and a resist is then removed to form a resultant guiding layer. Compared to other patterning processes, the nano-imprinting process, which is used to fabricate the plurality of guiding projections 3, has high patterning precision, which can reduce the spacing between two adjacent guiding projections 3, increase a layout density of the guiding projections 3, and reduce a width of the semiconductor nanowire 2 to be formed at a later stage, that is, the width of the semiconductor nanowire 2 extending along a direction parallel to an extending direction of the base substrate 1, such that the width of the semiconductor nanowire 2 can reach in nanoscale, thereby greatly increasing the number of the semiconductor nanowires 2 in the active layer, increasing the mobility and concentration of the carriers, and effectively improving the efficiency of the thin-film transistor.

Optionally, if the guiding projections 3 and the base substrate 1 are made of a same material, the guiding projections 3 may be fabricated directly on a side of the base substrate 1 close to the active layer. That is, the base substrate 1 and the guiding projection material layer may be patterned in a single process. For example, if the base substrate 1 and the guiding projection material layer belong to a same substrate structure, such as a glass substrate, the plurality of guiding projections 3 may be formed directly on a side of the glass substrate proximal to the active layer.

S3: Forming the active layer on the base substrate 1, including fabricating the plurality of semiconductor nanowires 2, each of which extends along a side wall of a corresponding guiding projection 3.

Specifically, S3 may include the following sub-steps: S31: forming guiding particles at one end of each of the plurality of guiding projections 3, as shown in FIGS. 8(*a*) to 8(*c*).

Specifically, referring to FIGS. 8(*a*) to 8(*b*), at first, a guiding material 02 may be deposited at one end of each of the plurality of guiding projections 3 using a sputtering process. Next, referring to FIGS. 8(*b*) to 8(*c*), in a plasma enhanced chemical vapor deposition (PECVD) system, the guiding material 02 is converted into the guiding particles 03 in nanoscale by a plasma treatment process in a hydrogen atmosphere and at a temperature ranging from 150° C. to 300° C.; and after the guiding particles 03 contact with a semiconductor material from which the semiconductor nanowires 2 are to be formed, the guiding particles 03 may guide the semiconductor material to grow along at least one side wall of the guiding projections 3 to form the semiconductor nanowires 2.

Optionally, the guiding material 02 and the guiding particles 03 have a same chemical element. For example, the guiding particles 03 may be particles of a metal such as indium (In), tin (Sn), bismuth (Bi) or the like. The guiding material 02 may be a material containing the chemical element of the guiding particles 03. For example, the guiding material 02 may be indium tin oxide (ITO), and the guiding particles 03 may be In particles. Specifically, after ITO is deposited at corresponding ends of the plurality of guide projections 3, in the PECVD system, ITO is reduced to a plurality of In particles in nanoscale by hydrogen ions through the plasma treatment process.

It is to be noted that, the end of the guiding projection 3 where the guiding material 02 is deposited, that is, the end where guiding particles 03 are provided, is a starting point end from which the semiconductor nanowire 2 starts growing.

S32: referring to FIGS. 8(*d*) to 8(*e*), depositing a layer of semiconductor material on a side of the plurality of guiding projections 3 away from the base substrate 1, wherein the semiconductor material, guided by the guiding particles 03, grows along corresponding side walls of the plurality of guiding projections 3 to form the semiconductor nanowires 2.

Specifically, when a chemical vapor deposition (CVD) chamber in the PECVD system reaches a temperature, for example, ranging from 180° C. to 220° C. (in particular, 200° C.), the layer of semiconductor material is deposited on a side of the plurality of guiding projections 3 away from the base substrate 1, and the semiconductor material is the material by which the semiconductor nanowires 2 are to be formed. Next, as shown in FIG. 8(*d*), under an inert or reducing gas and at a temperature ranging from 250° C. to 350° C., the guiding particles 03 located at corresponding ends of the guiding projections 3 are able to absorb the semiconductor material around them after contacting with the semiconductor material, which leads to the growth of the semiconductor nanowires 2, and the semiconductor nanowires 2, guided by the guiding particles 03, grow along corresponding side walls of the plurality of guiding projections 3, that is, along the first direction S1, thereby forming a plurality of semiconductor nanowires 2 extending along the first direction S1, as shown in FIG. 8(*e*). In the example of the semiconductor nanowires 2 being silicon nanowires, the semiconductor material may be amorphous silicon (a-Si), and a-Si grows along the side walls of the plurality of guiding productions 3 after contacting with the In particles (i.e., the guiding particles 03) to form a plurality of semiconductor nanowires 2, and the time for the growth of the semiconductor nanowires 2 is about 30 minutes.

Furthermore, in the example of the guiding particles 03, the semiconductor material and the semiconductor nanowires 2 being the In particles, a-Si and the silicon nanowires, respectively, as shown in FIG. 8(*d*), at a temperature ranging from 250° C. to 350° C., the In particles are in the form of droplets; the metallic droplets of In are able to absorb a-Si around them; once the content of Si in the metallic droplets of In is saturated, the metallic droplets of In precipitate crystalline silicon (c-Si) nuclear, which are to be arranged along the first direction S1 to form the silicon nanowires; as Gibbs free energy Ea of a-Si is greater than Gibbs free energy Ec of c-Si, the difference between their respective Gibbs free energies may be obtained by the following equation: Eac=Ea−Ecz≈0.12 eV, and the metallic droplets of In are able to decrease a transport capacity from a-Si to c-Si. That is, a solid (a-Si) to solid (c-Si) transition is changed into a solid-liquid-solid transition, and therefore, after having precipitated c-Si from a-Si, the metallic droplets of In, driven by Eac, continue to push the c-Si nuclear to grow along the side walls of the guiding projections 3, during which, the metallic droplets of In continue to absorb a-Si around the side walls and precipitate c-Si nuclear, and eventually, the c-Si nuclear grow to form the semiconductor nanowires 2 extending along the first direction S1.

Optionally, after the growth of semiconductor nanowires 2 is completed, there might be unwanted semiconductor material, which might need to be removed. In the example of the semiconductor material being a-Si, after the CVD chamber is cooled down to a temperature, for example, ranging from 180° C. to 220° C. (in particular, 200° C.), a-Si may be converted into polycrystalline silicon through an excimer laser annealing (ELA) process and then removed, so as to make surfaces of the semiconductor nanowires 2 clean.

Optionally, after the unwanted a-Si is removed, the semiconductor nanowires 2 may be subjected to a passivation treatment. For example, a passivation layer may be formed on the semiconductor nanowires 2 to protect the semiconductor nanowires 2 and prevent the semiconductor nanowires 2 from being damaged in subsequent processes.

Optionally, referring to FIG. 8(*f*), the method manufacturing of the thin-film transistor provided in embodiments of the present disclosure further includes forming a source electrode 41, a drain electrode 41 and a gate electrode 5. Depending on the structure of the thin-film transistor as described above, a sequence of forming the active layer, the source electrode 41, the drain electrode 42 and the gate electrode 5 may be adjusted accordingly. Taking a top-gate top-contact thin-film transistor (shown in FIG. 3) as an example, after the active layer (that is, the semiconductor nanowires) has been formed according to the steps as described above, a metal material forming the source electrode 41 and the drain electrode 42 is deposited on a side of the active layer away from the base substrate 1; a desired pattern of the source electrode 41 and the drain electrode 42 is then etched by a photolithography process; both electrodes are connected to the active layer by a punching process; next, a gate insulation layer 6 is formed on a side of the source electrode 41 and the drain electrode 42 away from the base substrate 1; next, a gate electrode 5 is formed on a side of the gate insulation layer 6 away from the base substrate 1; then, a protective layer 7 is formed on a side of the gate electrode 7 away from the base substrate 1, thereby forming the thin-film transistor.

The manufacturing method as described above can simplify the procedure of manufacturing a thin-film transistor.

Moreover, since the active layer of the thin-film transistor includes the plurality of semiconductor nanowires 2, channels for carriers increase, which can effectively increase mobility and concentration of the carriers and therefore improve the performance of the thin-film transistor; and since the lengths of the semiconductor nanowires 2 are not restricted, the size of the active layer is not restricted, which can enable the thin-film transistor to have an unrestricted size and be adaptable to display panels of various types.

Some embodiments of the present disclosure further provide an array substrate, including the thin-film transistor as described above, or including a thin-film transistor manufactured by the method as described above.

Specifically, the array substrate includes a driving circuit. When the array substrate is used to drive a light-emitting device, the driving circuit for a light-emitting device may include a plurality of thin-film transistors, such as a switching transistor, a driving transistor and the like, and at least one of these transistors may be the thin-film transistor provided in the embodiments of the present disclosure.

Some embodiments of the present disclosure further provide a display panel, including the array substrate as described above.

Optionally, the display panel may be any type, for example, an active-matrix organic light-emitting diode (AMOLED) display panel, a passive-matrix organic light-emitting diode (PMOLED) display panel, or any other type of display panel. Since an AMOLED typically has a relatively large size, and the size of the active layer in the thin-film transistor provided in the embodiments of the present disclosure is not restricted, the thin-film transistor can effectively drive the AMOLED display panel.

It is to be understood that the foregoing embodiments are merely exemplary embodiments for the purpose of illustrating the principle of the present disclosure, and the present disclosure is not limited thereto. Various modifications and improvements can be made by a person skilled in the art without departing from the spirit and essence of the present disclosure. Accordingly, all of the modifications and improvements also fall into the protection scope of the present disclosure.

The invention claimed is:

1. A thin-film transistor, comprising: a base substrate and an active layer on the base substrate, wherein
the active layer comprises a plurality of semiconductor nanowires; and
the thin-film transistor further comprises:
a plurality of guiding projections on a side of the base substrate close to the active layer, the plurality of guiding projections extending along a first direction and being arranged at intervals, each guiding projection of the plurality of guiding projections comprising two side walls extending along the first direction, and the plurality of semiconductor nanowires extending along at least one side wall of the plurality of guiding projections, respectively,
wherein the plurality of guiding projections are successively arranged along a second direction perpendicular to the first direction at equal intervals;
each of the plurality of guiding projections comprises a bottom surface in direct contact with the base substrate and a top surface opposite to the bottom surface, and a first side wall and a second side wall between the bottom surface and the top surface, all first side walls of the plurality of guiding projections facing towards a same direction, and all second side walls of the plurality of guiding projections face towards a same direction; and
the plurality of semiconductor nanowires are respectively only disposed on the first side walls facing towards the same direction or the second side walls facing towards the same direction.

2. The thin-film transistor according to claim 1, wherein the plurality of semiconductor nanowires are silicon nanowires; and/or
the base substrate is a glass substrate or a polyethylenimine substrate.

3. The thin-film transistor according to claim 1, wherein the base substrate and the plurality of guiding projections are of a one-piece structure.

4. The thin-film transistor according to claim 1, further comprising: a source electrode and a drain electrode arranged in a same layer and disposed on a side of the active layer away from the base substrate, and
the source electrode and the drain electrode connected to two ends of each semiconductor nanowire of the plurality of semiconductor nanowires.

5. An array substrate, comprising: a driving circuit comprising the thin-film transistor according to claim 1.

6. A display panel, comprising the array substrate according to claim 5.

7. The display panel according to claim 6, further comprising an active-matrix organic light-emitting diode or a passive-matrix organic light-emitting diode.

8. A manufacturing method of a thin-film transistor, comprising:
preparing a base substrate;
forming a plurality of guiding projections on the base substrate such that the plurality of guiding projections extend along a first direction and are arranged at intervals, and each guiding projection of the plurality of guiding projections comprises two side walls extending along the first direction; and
forming a plurality of semiconductor nanowires as an active layer on the base substrate such that the plurality of semiconductor nanowires extend along at least one side wall of the plurality of guiding projections, respectively,
wherein the plurality of guiding projections are successively arranged along a second direction perpendicular to the first direction at equal intervals;
each of the plurality of guiding projections comprises a bottom surface in direct contact with the base substrate and a top surface opposite to the bottom surface, and a first side wall and a second side wall between the bottom surface and the top surface, all first side walls of the plurality of guiding projections facing towards a same direction, and all second side walls of the plurality of guiding projections face towards a same direction; and
the plurality of semiconductor nanowires are respectively only disposed on the first side walls facing towards the same direction or the second side walls facing towards the same direction.

9. The manufacturing method according to claim 8, wherein the forming the plurality of guiding projections on the base substrate comprises:
depositing a layer of silicon oxide on a side of the base substrate close to the active layer to form a guiding projection material layer; and forming the plurality of guiding projections extending along the first direction on a side of the guiding projection material layer away from the base substrate by a patterning process.

10. The manufacturing method according to claim 9, wherein the forming the plurality of guiding projections extending along the first direction on the side of the guiding projection material layer away from the base substrate by the patterning process comprises:
forming the plurality of guiding projections extending along the first direction on the side of the guiding projection material layer away from the base substrate by a nano-imprinting process or a photolithography process.

11. The manufacturing method according to claim 8, wherein
a material of the base substrate and the plurality of guiding projections comprises glass, and
the forming the plurality of guiding projections on the base substrate comprises forming the base substrate and the plurality of guiding projections on the base substrate as a one-piece structure by a single process.

12. The manufacturing method according to claim 8, wherein the forming the plurality of semiconductor nanowires as the active layer on the base substrate comprises:
forming a plurality of guiding particles at ends of the first side walls or the second side walls of the plurality of guiding projections; and
depositing a layer of semiconductor material on a side of the plurality of guiding projections away from the base substrate such that the semiconductor material is guided by the plurality of guiding particles to grow along the first side walls or the second side walls of the plurality of guiding projections to form the plurality of semiconductor nanowires.

13. The manufacturing method according to claim 12, wherein the forming the plurality of guiding particles at the ends of the first side walls or the second side walls of the plurality of guiding projections comprises
depositing a guiding material at the ends of the first side walls or the second side walls of the plurality of guiding projections, wherein the guiding material and the plurality of guiding particles have a same chemical element; and
converting the guiding material into the plurality of guiding particles by a plasma treatment in a plasma enhanced chemical vapor deposition system.

14. The manufacturing method according to claim 13, wherein the guiding material is indium tin oxide, and the plurality of guiding particles are indium.

15. The manufacturing method according to claim 14, wherein the depositing the layer of semiconductor material on the side of the plurality of guiding projections away from the base substrate such that the semiconductor material is guided by the plurality of guiding particles to grow along the first side walls or the second side walls of the plurality of guiding projections to form the plurality of semiconductor nanowires comprises
depositing the layer of semiconductor material on the side of the plurality of guiding projections away from the base substrate at a temperature ranging from 180° C. to 220° C.; and
forming the plurality of semiconductor nanowires by causing the semiconductor material to be guided by the plurality of guiding particles to grow along the first side walls or the second side walls of the plurality of guiding projections under an inert or reducing gas and at a temperature ranging from 250° C. to 350° C.

16. The manufacturing method according to claim 12, wherein the semiconductor material comprises amorphous silicon, and the plurality of semiconductor nanowires comprise silicon nanowires.

17. The manufacturing method according to claim 16, wherein after the forming the plurality of semiconductor nanowires by causing the semiconductor material to be guided by the plurality of guiding materials to grow along the first side walls or the second side walls of the plurality of guiding projections under the inert or reducing gas and at the temperature ranging from 250° C. to 350° C., the manufacturing method further comprises: converting the amorphous silicon into polycrystalline silicon by an annealing process at a temperature ranging from 180° C. to 220° C., and removing the polycrystalline silicon.

18. The manufacturing method according to claim 17, wherein after the removing the polycrystalline silicon, the manufacturing method further comprises performing a passivation treatment on the plurality of semiconductor nanowires.

* * * * *

UNITED STATES PATENT AND TRADEMARK OFFICE
CERTIFICATE OF CORRECTION

PATENT NO. : 12,328,910 B2  
APPLICATION NO. : 17/772689  
DATED : June 10, 2025  
INVENTOR(S) : Jiayu He et al.

Page 1 of 1

It is certified that error appears in the above-identified patent and that said Letters Patent is hereby corrected as shown below:

On the Title Page

Item (73) Assignee, please remove the Assignee:
"BOE TECHNOLOGY GROUP CO., TD." and replace with "BOE TECHNOLOGY GROUP CO., LTD."

Signed and Sealed this  
Twenty-sixth Day of August, 2025

Coke Morgan Stewart  
*Acting Director of the United States Patent and Trademark Office*